Aug. 13, 1968 KATSUO SATO ET AL 3,396,452

METHOD AND APPARATUS FOR BREAKING A SEMICONDUCTOR WAFER INTO ELEMENTARY PIECES

Filed May 27, 1966 2 Sheets-Sheet 1

INVENTORS.
KATSUO SATO
YOSHIAKI NAKAMURA
BY
Hopgood & Calimafde
ATTORNEYS

INVENTORS.
KATSUO SATO
YOSHIAKI NAKAMURA
BY
Hopgood & Calimafde
ATTORNEYS.

United States Patent Office 3,396,452

Patented Aug. 13, 1968

3,396,452
METHOD AND APPARATUS FOR BREAKING A SEMICONDUCTOR WAFER INTO ELEMENTARY PIECES

Katsuo Sato and Yoshiaki Nakamura, Tokyo, Japan, assignors to Nippon Electric Company, Limited, Tokyo, Japan, a corporation of Japan Filed May 27, 1966, Ser. No. 553,329
Claims priority, application Japan, June 2, 1965, 40/32,600
7 Claims. (Cl. 29—413)

ABSTRACT OF THE DISCLOSURE

A preliminarily scribed semiconductor wafer is advanced and subjected to pressure between a pair of opposing rollers of differing resiliencies. The softer resiliency roller being contiguous the scribed face thereby causes the wafer to break at the scribe lines.

This invention relates to a method and apparatus for breaking wafers, particularly semiconductor wafers, into elementary pieces.

Conventionally, semiconductor wafers are broken into discrete pieces by first scribing them along predetermined lines; sandwiching them between a pair of thin plastic films; and then applying a wedge to the reverse side of the scribe lines. To effect the total separation of each piece, the wedge must first be pushed against the back of the scribe lines of one direction and then against the back of the orthogonal scribe lines. Care must therefore be exercised during the breaking process to ensure that some of the broken pieces do not become displaced, superposed on one another, or put into any disarray whereby some portion of the wafer remains unbroken. A conventional device in which a scribed and sandwiched wafer is pressed between a pair of complementary convex and concave dies exhibits just such a defect in that a portion of the wafer is frequently left unbroken. The application of a wedge against each scribe line, on the other hand, is reliable but requires a manual operation which is inefficient and extremely difficult to automate.

Accordingly, it is the object of the present invention to provide a method and apparatus for breaking a scribed wafer into elementary pieces, leaving neither unbroken segments nor disarranging the broken pieces.

It is another object of this invention to provide an apparatus of the foregoing type which may be used with a wafer sandwiched between plastic films and which aids rather than disturbs the cohesion between the film and wafer.

It is still another object of this invention to provide a method and apparatus which is operable in a serial progression and hence automatic basis.

And it is a still further object of this invention that it is applicable to wafers of varying thickness and piece dimension.

Briefly, the invention is premised upon the passing of a preliminarily scribed and sandwiched wafer between a pair of cooperating rollers of different resiliencies; the rollers being adapted to simultaneously feed the wafer and exert pressure upon it. Preferably, the wafer is supplied to the rollers in such a manner that the lines of scribe are parallel to the axes of the rollers whereby the different roller resiliencies impart a bending moment on the wafer which results in breakage at the scribe lines.

The above mentioned and other features and objects of this invention and the manner of attaining them will become more apparent and the invention itself will best be understood by reference to the following description of embodiments of the invention taken in conjunction with the accompanying drawings wherein.

Figure 1:
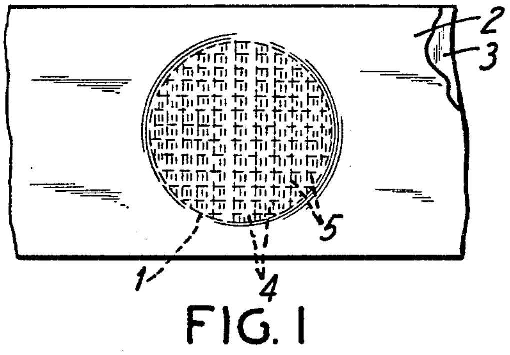
FIG. 1 is a plan view of a semiconductor wafer to be broken into elementary pieces.

Referring now to FIG. 1, there is shown a semiconductor wafer 1 sandwiched between a pair of thin plastic films 2 and 3. Orthogonal scribe lines 5 are preliminarily provided, and along these lines the wafer 1 will be broken into elementary pieces 4. (Throughout the figures, similar numerals will designate similar parts.)

Figure 2:
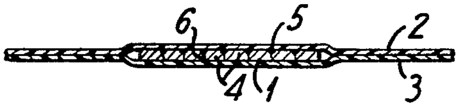
FIG. 2 is a sectional view of the wafer after being broken.
Figure 3:
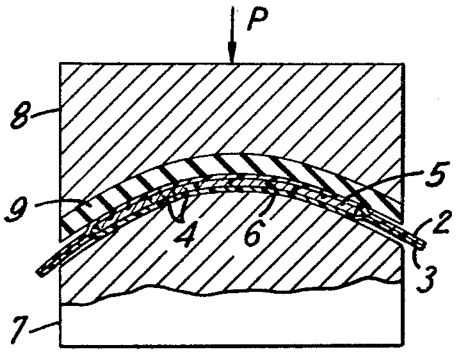
FIG. 3 (PRIOR ART)
FIG. 3 is a cross-sectional view of one conventional tool for breaking wafers.

In FIG. 2, the elementary pieces 4 are shown already separated from one another at lines 6, but still held together by the plastic films 2 and 3. FIG. 3 shows a conventional tool for carrying out such a separation. It comprises a convex cylindrical base member 7, having a curvature suitable to the dimensions of the elementary pieces 4 into which the sandwiched wafer is to be broken; and a complementary concave member 8. The latter is applied under a pressure P against the wafer which rests on the convex member 7. The surface of the concave member 8 may be provided with a layer of a resilient material 9.

The disadvantage with this type of tool is that unbroken pieces inevitably result. During downward movement, the concave member 8 touches the wafer initially at two edges while the convex member 7 is in contact with the wafer along its center line. The wafer therefore undergoes its greatest bending moment along the center scribe line. As a consequence, breaking takes place at the center portion first. Since only the component of the force P normal to the surface of the wafer serves to break it, and as the portions of the wafer nearer to both sides become more inclined as the breaking progresses, it is inevitable that unbroken pieces will remain near the sides of the wafer. Furthermore, the arcuation of the wafer results in an expansion of the front plastic film 2 and a contraction of the back plastic film 3; thus giving rise to a tendency towards separation of the wafer from the film.

Figure 4:
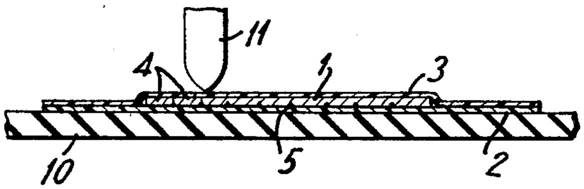
FIG. 4 (PRIOR ART)
FIG. 4 is a cross-sectional view of another conventional tool.

FIG. 4 shows another conventional breaking tool; it comprises a suitably resilient base 10 of rubber or similar material, on which the scribed and sandwiched wafer is placed with the scribed surface facing the base. A wedge or a cylindrical bar 11 is then applied against the back of the sandwiched wafer along each scribe line 5. While this arrangement prevents the leaving of any unbroken pieces, it is extremely difficult to align the wedge 11 with the scribe lines since it is applied from the back side of the wafer. Furthermore, such a tool is discontinuous and does not lend itself to automation.

In contrast, this invention not only obviates the aforementioned defects, but it is also flexible in that elementary pieces of a variety of dimensions may be obtained in a continuous progressive operation. Further, with the method of the invention, the breaking is so reliable the limitations heretofore imposed on the thickness of the wafer may be relieved. For example, it is presently necessary to preliminarily reduce the thickness of a silicon wafer to less than 0.10–0.15 mm. in order to get elementary pieces of 0.5 x 0.5 $mm.^2$. With this invention, however, it is possible to achieve the same dimensions with a silicon wafer of the thickness of about 0.25 mm. This obviates the process of etching or grinding the back side of, in particular, wafers producing diffusion type epitaxial semiconductor elements. It also prevents the wafer breaks which now occur at the conventional backside etching and scribing steps, and it therefore augments the yield of the semiconductor elements and reduces the price of the product.

Figure 5:
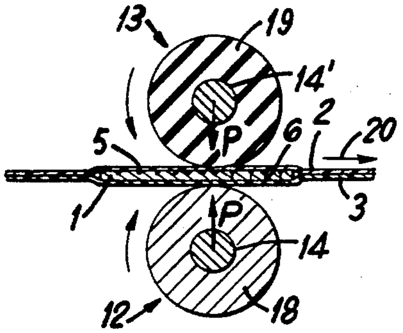
FIG. 5 is a cross-sectional view of an embodiment of this invention.

Referring now to FIG. 5, the first embodiment of the invention will be described. The wafer 1 may, as in the conventional arrangement, be sandwiched between a pair of plastic films 2 and 3. So sandwiched, the wafer is passed between a pair of juxtaposed rollers 12 and 13, mounted upon axles 14 and 14'. At least one of the rollers is driven in the direction shown by the arrows and a force P is imposed which urges the rollers towards one another. For simplicity, and since this invention is not directed towards such apparatus, the means for driving the rollers and imposing the forces thereon are not shown. However, it will be appreciated that the force may be applied by supporting one of the roller axles in a parallelly adjustable manner with respect to the other and providing means such as screws or levers for urging the movable roller towards the stable one. Roller drive, on the other hand, may be imparted by sprocket, belt, or worm gears, for example, and may be applied to only one of the rollers; preferably, the axially stable roller.

It is a feature of this invention that the material surrounding axles 14 and 14' be distinctly different in resiliency.

Portion 18 of the roller 12 is made of a hard, resilient material such as a metal, ceramic, Bakelite, hard polyvinyl chloride resin, or the like; while portion 19 of the other roller 13 is of a soft resilient material, such as rubber, synthetic rubber, silicone rubber, plastic, foamed synthetic resin, or the like. Thus, the soft resilient material would have the property of being much more easily displaced by an applied force than the hard, resilient material which would tend to retain its shape under stress. Both materials would have that resilient characteristic of internal forces seeking to return it to its original shape. The wafer 1 interposed between the thin plastic films 2 and 3 is fed through the rollers 12, 13 in a direction shown by the arrow 20, with the scribe lines 5 in parallel with the roller axes. The scribed surface of the wafer is faced towards the more resilient roller 13. When one of the scribe lines passes between the rollers, it is subjected to pressures (which will be described) causing the wafer to break at the line of scribe, but remain in position because of the plastic film. Subsequent to the breaking, which occurs a scribe line at a time as the wafer passes through the rollers, the wafer is either reintroduced to these rollers in an orthogonal direction for breaking the wafer along the orthogonal scribe lines, or the sandwiched wafer is fed to a second set of orthogonal rollers for this purpose.

Figure 6:
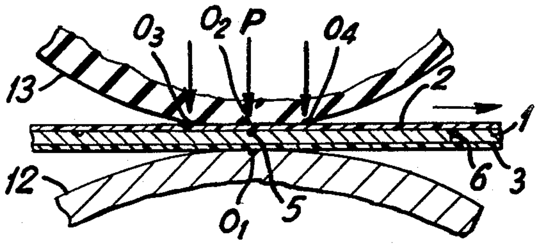
FIG. 6 shows a portion of FIG. 5 on an enlarged scale.

FIG. 6 illustrates the forces incurred by the sandwiched wafer as it passes through the rollers 12 and 13. It may be seen that the hard, resilient roller 12 is contiguous the back side of the wafer (through the intermediary of the plastic film 3) only at the point $O_1$. The soft resilient roller 13, on the other hand, is in contact with the wafer over a surface which extends on either side of $O_2$. Thus, when one of the scribe lines 5 passes through the imaginary line joining $O_1$ and $O_2$, the wafer undergoes a bending moment exerted by the roller portions $O_3$ and $O_4$ against the fulcrum $O_1$. By selecting the pressure P and the resiliencies of the respective rollers, the bending moment may be exerted in excess of that required to break the wafer at the scribe line and less than that which would break it at portions other than the lines of scribe. In other words, the curvature of the rollers, their respective materials, and the applied pressures are so selected that the bending moment for actual breaking is directed solely to the one line of scribe under consideration. The speed of the roller should be such that the bending moment is applied during a sufficient time interval for the breaking to start at the scribe surface and reach the back surface.

Since breaking is carried out each time a scribe line passes through the imaginary line connecting $O_1$ and $O_2$, the same apparatus may be used to break wafers of different dimensions, without changing the curvature of the rollers. Further, since the wafer is subjected to a given pressure P and hence the same bending moment at each line of scribe 5, no unbroken pieces will remain. The fact that the wafer is neither bent nor arcuated, nor are the plastic films 2 and 3, aids in the cohesion of the film to the wafer and precludes their premature separation.

The foregoing method was found to achieve excellent results upon a circular, brittle silicon wafer of a diameter of 2.5 cm. (area 9.8 $cm.^2$), of a thickness .25 mm., and a modulus of elasticity of $11.3\times10^5$ $kg./cm.^2$. The following parameters were employed. One surface of the wafer was scribed by a diamond point, leaving orthogonal lines spaced by .5 mm., which was the length of one side of a semiconductor element to be produced. Subsequently, the wafer was sandwiched between a pair of 10-micron thick synthetic resin films of polyvinylidene chloride. Mere superposition of the films on the wafer showed sufficient cohesion. With the silicon surface mirror-finished by chemical etching, the cohesive force was found to be from 1.5 to 2 $kg./cm.^2$. This obviated the necessity of a wax or other foreign adhesive. The hard, resilient roller 12 was carbon steel of a diameter of 25 mm. and a modulus of elasticity of $2.1\times10^6$ $kg./cm.^2$. The soft, resilient roller was of a smaller diameter and made of neoplene synthetic rubber of a modulus of elasticity of 10 $kg./cm.^2$. The axle 14' of the soft, resilient roller 13 was urged by screws against the hard, resilient roller 12 under a pressure of 4 $kg./mm.^2$. The rollers 12 and 13 were caused to rotate at a speed of 1 r.p.m. When subjected to this apparatus, the sandwiched wafer was completely broken along the lines of scribe and held between the thin polyvinylidene films 2 and 3 in an orderly array. Subsequently, the films 2 and 3 were easily removed by peeling them off in the direction parallel to the surface of the wafer, again leaving the elementary pieces in order. It is preferable that the films be removed immediately before the elementary semiconductor pieces are needed so that they may be maintained in a hermetically sealed state.

The rollers 12 and 13 may also have different diameters. For example, satisfactory results were also obtained with one of the rollers having a diameter of 5 mm. and the other with a diameter of 15 mm. It was found preferable, however, to have the diameters fall between 5 and 30 mm. With the rollers 12 and 13 having the dimensions recited above, it was found possible to produce semiconductor pieces of side dimensions varying between .3 to 5.2 mm. It has also been found preferable for a pressure from 4–10 $kg./mm.^2$ and a speed of 1–2 r.p.m. for elementary pieces having sides of a length from .3–1.0 mm., and a pressure and speed of 4–6 $kg./mm.^2$ and 1–4 r.p.m., respectively, for side lengths from 1–5 mm. While conventional tools have been found to be applicable to wafers of the thickness from .10–.15 mm., the invention was found to be operable upon wafers of the thickness from .1–.3 mm. or more. As was mentioned this is particularly advantageous for manufacturing expitaxial semiconductor devices.

Figure 7:
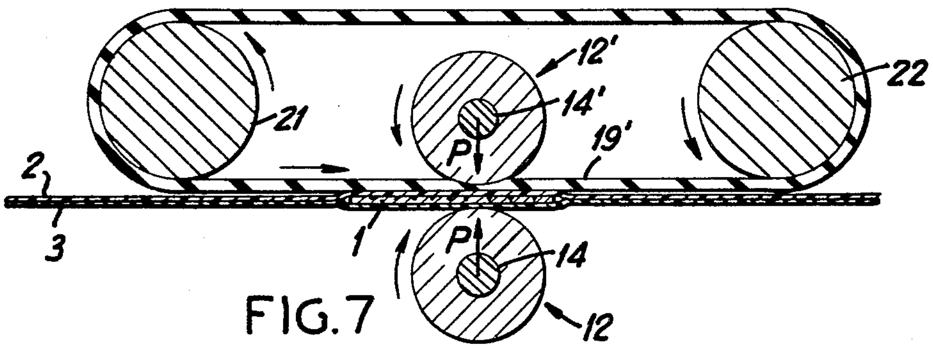
FIG. 7 is a cross-sectional view of another embodiment of this invention.

FIG. 7 illustrates an alternative embodiment of this invention wherein rollers 12 and 12', which are of a diameter of 25 mm., are both made of carbon steel of a modulus of elasticity of $2.1\times10^6$ $kg./cm.^2$. In this case, however, an endless belt 19' passes between the two rollers and around idlers 21 and 22. The belt is about 2 mm. thick and travels tangentially to the roller 12'.

It is made of neoplene synthetic rubber of a modulus of elasticity of 8–10 kg./cm.$^2$ and a tensile strength of 200–300 kg./cm.$^2$. The preferred rate of rotation for the rollers 12 and 12′ is 1–4 r.p.m. The sandwiched wafer is fed to the apparatus with the scribed surface directed towards the belt 19′. As with the previous embodiment, variations are possible between the pressure P, the material, this time—of the belt, and the diameters of the rollers.

Figure 8:
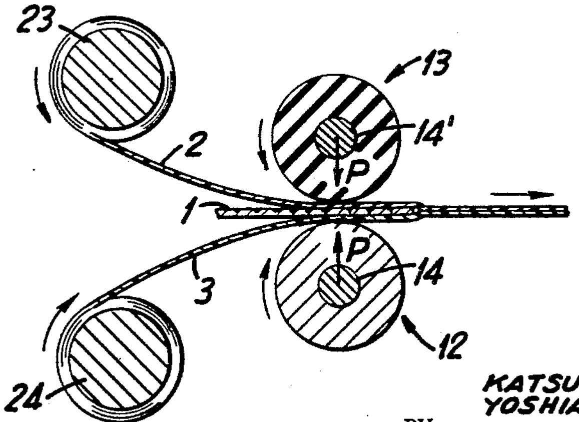
FIG. 8 is a cross-sectional view of a still further embodiment of this invention.

In FIG. 8 another embodiment of the invention is shown. In this embodiment, spools 23 and 24 of the thin plastic films 2 and 3 are overlaid on both surfaces of the wafer 1 while the wafer is being fed between the rollers. In other words, the wafer is not preliminarily sandwiched between films, but is put between the films during the process of rolling.

While the principles of the invention have been described in connection with specific apparatus, it is to be clearly understood that this description is made only by way of example and not as a limitation to the scope of the invention as set forth in the objects thereof and in the accompanying claims. For example, while this invention has been described with respect to semiconductor wafers, it is also applicable to the breaking of glass or quartz and similar brittle material, provided suitable values are selected for the pressure, roller resiliency, etc. It has been found that material of greater breaking strength requires greater pressure for the rollers and a material of relatively larger modulus of elasticity for the rollers 12 and 13 to avoid widening of the area of contact with the sandwiched wafer.

We claim:

1. The process of breaking a brittle sheet material into elementary pieces comprising the steps of:

linearly scribing one side of said sheet along lines of intended breakage; and feeding said sheet perpendicularly to said scribe lines through a pair of axially parallel rollers of respectively hard and soft resiliency, the scribed side of said sheet facing said soft resilient rollers, with sufficient pressure being imparted by the rollers to progressively break said sheet at the scribe lines.

2. The process claimed in claim 1 wherein said sheet is a semiconductor wafer and wherein said process further comprises the step of sandwiching said sheet between a pair of thin films subsequent to said step of scribing.

3. The process claimed in claim 2 wherein said films are applied simultaneously with the passage of said wafer through said rollers.

4. The process of breaking a brittle sheet material into elementary pieces comprising the steps of:

linearly scribing one side of said sheet along lines of intended breakage; and feeding said sheet perpendicularly to said scribe lines through a pair of hard resilient axially parallel rollers; and simultaneously passing an endless belt of soft resilient material between said rollers contiguous the scribed side of said sheet with sufficient pressure being imparted by the rollers to progressively break said sheet at the scribe lines.

5. The process claimed in claim 4 wherein said sheet is a semiconductor wafer and wherein said process further comprises the step of sandwiching said sheet between a pair of thin films subsequent to said step of scribing.

6. An apparatus for breaking a semiconductor wafer having scribed lines on the surface thereof to elementary pieces comprising: a pair of rotatively mounted parallel axles; means for driving at least one of said axles; means for urging at least one of said axles towards the other; a material of hard resiliency uniformly covering the side surface of one of said axles; an endless belt disposed about the side surface of the other of said axles, said belt being of a material of soft resiliency and having a length greater than the circumferential length of said other axle whereby a scribed semiconductor wafer fed between said hard material on said one of said axles and said belt, with said scribed line parallel said axles and directed towards said belt is subject to a bending moment due to the elastic deformation of said belt and is broken into elementary pieces.

7. The process of breaking a brittle sheet material into elementary pieces comprising the steps of:

linearly scribing one side of said sheet along the line of intended breakage; and feeding said sheet perpendicularly to said scribe lines through an advancing medium presenting a curved hard resiliency surface contiguous the non-scribed side of the sheet and a relatively soft resiliency surface contiguous the scribed side of said sheet, with sufficient pressure being imparted upon opposing surfaces to progressively break said sheet at the scribe lines.

References Cited

UNITED STATES PATENTS

| | | | |
|---|---|---|---|
| 2,286,960 | 6/1942 | Hall | 225—98 |
| 2,970,730 | 2/1961 | Schwartz | 225—2 |
| 3,040,489 | 6/1962 | Da Costa | 53—21 |
| 3,149,765 | 9/1964 | Horning et al. | 225—97 |
| 3,182,873 | 5/1965 | Kalvelage et al. | 225—2 |
| 3,206,088 | 9/1965 | Meyer et al. | 225—2 |
| 2,792,623 | 5/1957 | Melidonis | 72—185 |
| 2,971,256 | 2/1961 | Leflon | 29—413 X |
| 3,195,225 | 7/1965 | Belliveau et al. | 29—610 |
| 3,254,396 | 6/1966 | Mushey | 29—413 X |

THOMAS H. EAGER, *Primary Examiner.*